(12) United States Patent
Davison et al.

(10) Patent No.: US 6,476,472 B1
(45) Date of Patent: Nov. 5, 2002

(54) INTEGRATED CIRCUIT PACKAGE WITH IMPROVED ESD PROTECTION FOR NO-CONNECT PINS

(75) Inventors: Kerry L. Davison, Allentown; Donald E. Hawk, Jr., King of Prussia; Yehuda Smooha, Allentown, all of PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/641,899

(22) Filed: Aug. 18, 2000

(51) Int. Cl.[7] ............................................. H01L 23/02
(52) U.S. Cl. ...................... 257/678; 257/691; 257/784; 257/786
(58) Field of Search ................................ 257/723–726, 257/691, 784, 786, 698, 696, 782; 361/777

(56) References Cited

U.S. PATENT DOCUMENTS

| | | | |
|---|---|---|---|
| 4,975,761 A | 12/1990 | Chu ............................ | 357/72 |
| 5,045,921 A | 9/1991 | Lin et al. ...................... | 357/74 |
| 5,216,278 A | 6/1993 | Lin et al. ..................... | 257/688 |
| 5,355,283 A | 10/1994 | Marrs et al. ................. | 361/760 |
| 5,400,220 A | 3/1995 | Swamy ....................... | 361/760 |
| 5,420,460 A | 5/1995 | Massingill .................. | 257/693 |
| 5,506,756 A | 4/1996 | Haley ......................... | 361/789 |
| 5,541,450 A | 7/1996 | Jones et al. ................. | 257/697 |
| 5,715,127 A | * 2/1998 | Yu .............................. | 361/111 |
| 5,869,870 A | * 2/1999 | Lin ............................. | 257/355 |
| 5,969,929 A | * 10/1999 | Kleveland et al. .......... | 361/111 |
| 6,008,532 A | * 12/1999 | Carichner ................... | 174/261 |
| 6,025,631 A | * 2/2000 | Lin ............................. | 257/355 |
| 6,078,068 A | * 6/2000 | Tamura ...................... | 257/203 |
| 6,084,777 A | * 7/2000 | Kalidas et al. ............. | 257/707 |
| 6,246,566 B1 | * 6/2001 | Glenn ........................ | 206/710 |

FOREIGN PATENT DOCUMENTS

JP 06232332 A * 8/1994 ........... H01L/23/60

* cited by examiner

*Primary Examiner*—Olik Chaudhuri
*Assistant Examiner*—Nathan W. Ha
(74) *Attorney, Agent, or Firm*—Duane Morris LLP; Steven E. Koffs

(57) ABSTRACT

An integrated circuit (IC) package includes an IC having at least one ESD protection circuit that provides protection against electrostatic discharge. The IC has a plurality of bond pads that are not coupled to the ESD protection circuit. The IC is connected to a substrate. The substrate has a first plurality of conductive traces, which are connected to respective bond pads of the IC, and a second plurality of conductive traces, which are not connected to any of the plurality of bond pads of the IC. Either the substrate or the IC has a common conductive trace that is connected to the ESD protection circuit. Each of the second plurality of conductive traces is connected to the common conductive trace.

9 Claims, 4 Drawing Sheets

US 6,476,472 B1

INTEGRATED CIRCUIT PACKAGE WITH IMPROVED ESD PROTECTION FOR NO-CONNECT PINS

FIELD OF THE INVENTION

The present invention relates to integrated circuits generally, and more specifically to structures and method for protecting integrated circuits against electrostatic discharge (ESD).

DESCRIPTION OF THE RELATED ART

Ball Grid Array (BGA) packages are well known. An exemplary BGA package is described in U.S. Pat. No. 5,216,278 to Lin et al., which is incorporated by reference herein in its entirety. In a BGA package, an integrated circuit (IC) die or chip is mounted on a top surface of a substrate. The substrate has a plurality of conductive traces. The IC chip has a plurality of bond pads. The bond pads of the IC chip are connected (for example, by wire bonding, tape automated bonding, or flip-chip bonding) to respective ones of the conductive traces on the top surface of the substrate. The substrate has an array of solder balls (typically in a rectangular grid) on the bottom surface opposite the surface to which the IC is mounted. The substrate has electrical paths connecting the conductive traces on the top surface to respective solder balls on the bottom surface. The package is placed on a printed wiring board, and heated to reflow the solder balls on the bottom of the substrate, to form the connections between the IC bond pads and elements on the printed wiring board. The BGA package allows a high density of connections to the printed wiring board.

To reduce manufacturing costs, it is desirable to use a single common type of substrate to accommodate different variations of an IC chip, or a family of similar chips. For this purpose, a substrate is provided with a set of conductive traces corresponding to any of the bond pads that may be present on any of the IC chips that are to be used with the same type of substrate. In any given BGA package, the IC chip may have a number of bond pads that is less than the number of conductive traces on the substrate. The extra conductive traces on the substrate are referred to herein as "no-connect pins." For example, a substrate having a 256 ball grid array may be used with an IC that only has between 180 and 200 I/O bond pads.

A BGA package with no-connect pins typically exhibits an electrostatic discharge (ESD) threshold that is lower than an otherwise similar BGA package without no-connect pins. For example, ESD stressing on one of the no-connect pins results in a discharge through an adjacent BGA pin.

Attempts have been made to deal with the ESD problem in BGA packages with no-connect pins. Typically, the solution has been to avoid ESD testing of the no-connect pins, thus avoiding application of a high voltage charge to a no-connect pin. This is possible, because ESD specifications currently do not require ESD testing for the noconnect pins. However, it is likely that future ESD specifications will require ESD testing of the no-connect pins.

SUMMARY OF THE INVENTION

The present invention is an integrated circuit (IC) package including an IC. The IC has at least one ESD protection circuit that provides protection against electrostatic discharge. The IC has a plurality of bond pads that are not coupled to the ESD protection circuit. The IC is connected to a substrate. The substrate has a first plurality of conductive traces, which are connected to respective bond pads of the IC, and a second plurality of conductive traces, which are not connected to any of the plurality of bond pads of the IC. Either the substrate or the IC has a common conductive trace that is connected to the ESD protection circuit. Each of the second plurality of conductive traces is connected to the common conductive trace.

DETAILED DESCRIPTION

Figure 1:
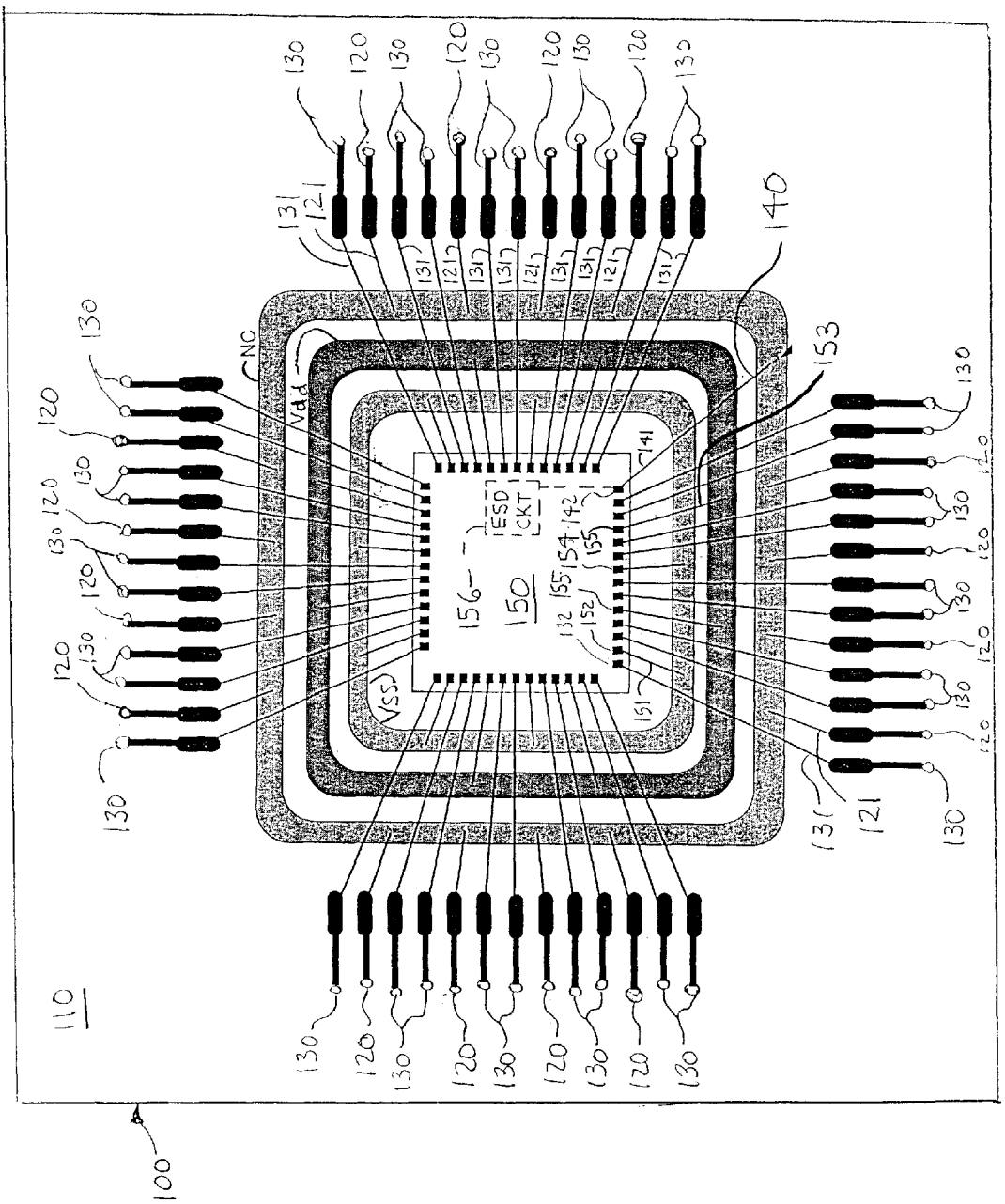
FIG. 1 is a plan view of a BGA package according to the present invention.
Figure 2:
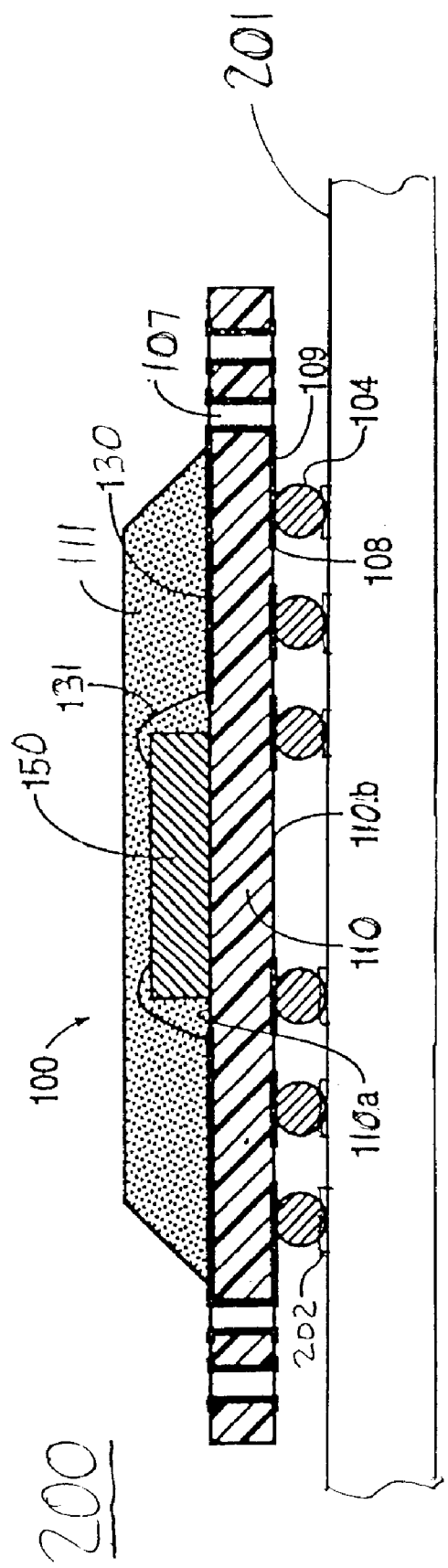
FIG. 2 is a side sectional view of a printed circuit board including the package of FIG. 1.

FIG. 1 shows a BGA integrated circuit (IC) package 100 according to the present invention, and FIG. 2 shows a printed circuit board 200 including the package. FIG. 1 shows the substrate 110, IC chip 150, and various electrically conductive paths.

The top surface of the IC chip 150 is shown, including bond pads 132, 142, 152 and 154. The IC chip 150 may be any type of IC device, including, but not limited to, a processor, a memory, a bus, an amplifier, a filter, an application specific IC or the like.

A plurality of bond pads 132 on IC chip 150 are connected to a plurality of conductive traces 130 on the surface 110a of substrate 110, by way of wire bonds 131. For each of the plurality of bond pads 132 on the IC, there is a corresponding one of the first plurality of conductive traces 130 on the substrate 110. However, the substrate 110 has some conductive traces 120 (the "no-connect pins") for which the IC 150 does not have corresponding bond pads. The plurality of bond pads 132 includes every bond pad on the IC except for: at least one ESD protection bond pad 142 coupled to the ESD protection circuit 156, at least one bond pad 155 coupled to power (Vdd) and at least one bond pad 154 coupled to ground (Vss).

It will be understood that a given conductive trace on a substrate may be designated a "no-connect pin 120" when a first type of IC chip is used with the substrate, and as a connected pin 130 when a second type of IC chip is connected to the substrate. None of the conductive traces 120 or 130 is inherently a no-connect pin. Rather, a conductive trace becomes a no-connect pin when the substrate is used in conjunction with a type of IC that has no bond pad corresponding to that conductive trace.

The substrate 110, to which the IC chip 150 is connected, may be made of a resin material, glass-epoxy circuit board material, or other polymer materials such as polyimide or the like. The substrate 110 has a first plurality of conductive traces 130 on its top side 110a, which are connected to respective bond pads 132 of the IC chip 150. The conductive traces 130 are connected to solder balls 104 (FIG. 2) on the side 110b of the substrate 110 opposite the conductive traces by way of electrically conductive paths 107 through the substrate, which are well known in the art. The total number of conductive traces 130, 120 on the substrate 110 is typically greater than a number of bond pads on the IC 150. Thus, the total of the number of active conductive traces 130 and no-connect conductive traces 120 likely exceeds the number of bond pads 132 on the IC chip 150.

The substrate 110 has a second plurality of conductive traces 120, which are not connected to any of the plurality of bond pads of the IC, and are referred to herein as "no-connect pins." None of the second plurality of conductive traces corresponds to any of the plurality of bond pads on the IC. The substrate 110 has a common conductive trace NC (a "no-connect ring") that is connected to the ESD protection circuit 156 by way of an ESD bond pad 142 and a wire bond 141. Each of the second plurality of conductive traces 120 is connected to the common conductive trace NC (the "no-connect ring").

At least one ESD protection circuit 156 on IC chip 150 provides protection against electrostatic discharge. The ESD protection circuit 156 may be a dual diode circuit. A respective bond pad 142 is provided for each ESD circuit 156. At least one bond pad 155 on IC chip 150 is connected to the drain voltage ring Vdd by way of wire bond 153, and at least one bond pad 154 is connected to source voltage ring Vss by way of wire bond 151. The bond pads 154 and 155 are not coupled to the ESD protection circuit 156. The underside (not shown) of the IC 150 is attached to the substrate 110.

In the exemplary IC package 100 of FIG. 1, the common conductive trace NC (the no-connect ring) is a closed path surrounding the IC 150. Two additional rings, power ring Vdd and ground ring Vss are provided between the IC 150 and the no-connect ring NC. Although the exemplary Vss ring is closest to the IC 150 and the no-connect ring NC is furthest, it is contemplated that the order of the three rings may be changed from that shown in FIG. 1.

FIG. 2 shows a printed circuit board 200 including a circuit board substrate 201 having a BGA package 100 and other circuitry (not shown) thereon. The BGA integrated circuit (IC) package 100 is electrically connected to the circuit board substrate 200 by a plurality of solder ball connections 104. BGA package 100 may be of the type described above with respect to FIG. 1. The plurality of solder balls 104 form electrical connections between the bottom 110b of IC substrate 110 and contacts 202 on the circuit board substrate 201. Also shown in FIG. 2 is an encapsulant 111 that protects the wirings 121 and 131, and vias 107 that connect wirings on the bottom 110b of substrate 110 to wirings 130 on the top surface 110a of the substrate 110. Although FIG. 2 shows the wire bonded package of FIG. 1, one of the other types of BGA packages described below may be used in a printed circuit board according to the invention.

Figure 3:
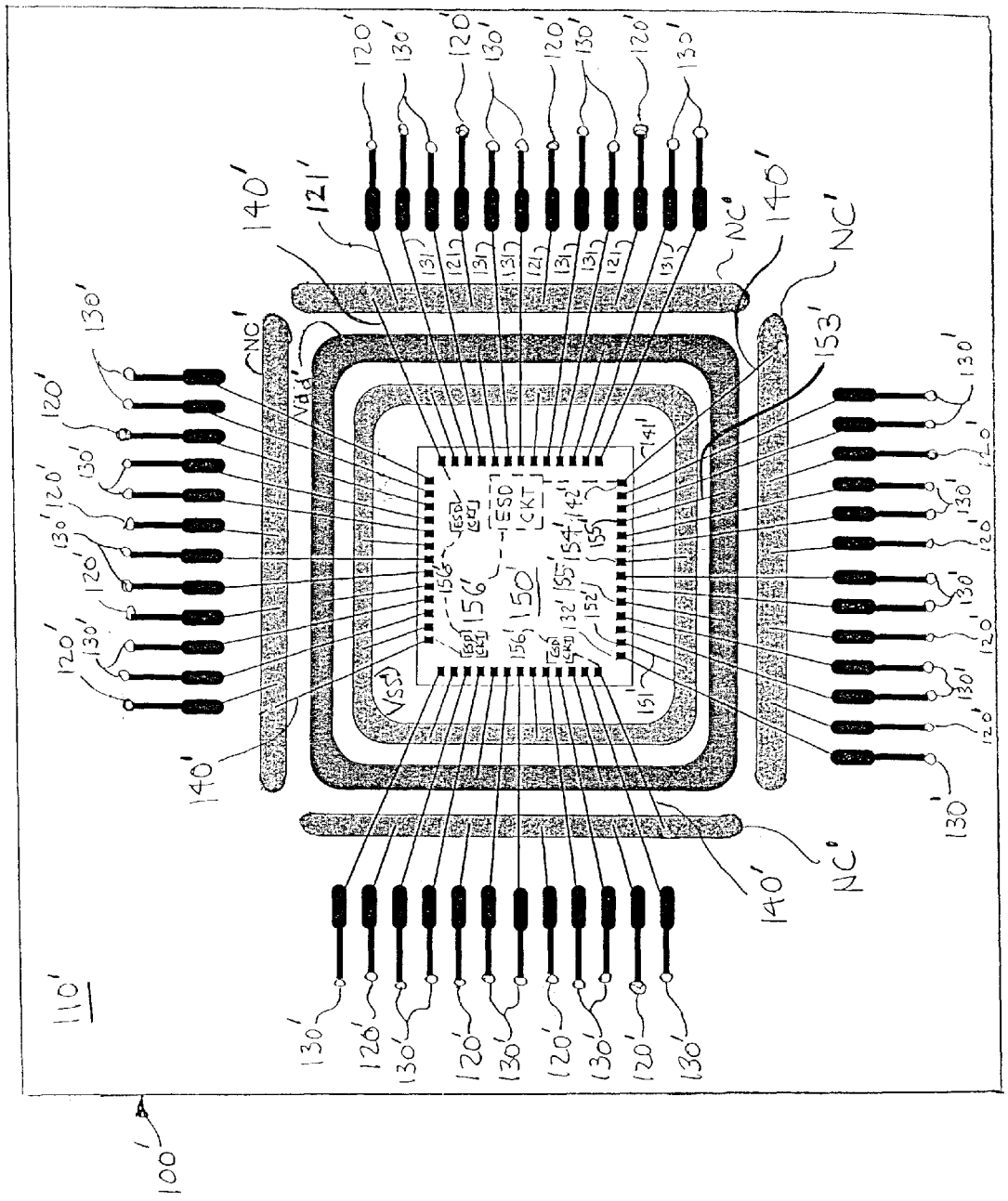
FIG. 3 is a plan view of a variation of the package of FIG. 1.

FIG. 3. shows a variation of the embodiment of FIG. 1. Elements of FIG. 3 that correspond to like elements in FIG. 1 have the same reference numeral, with the prime (') designation added. In FIG. 3, the IC 150' has a respective ESD protection circuit 156' with a respective bond pad 142' on each side of the IC 150'. The exemplary substrate 110' has a respective set of one or more no-connect conductive traces 120' on each side of the IC 150', but the no-connect traces may be included on fewer than all of the sides. The no-connect conductive traces 120' are not connected to any of the plurality of bond pads 132 of the IC 150.

On each side of the IC 150' is located a respective common conductive trace NC', corresponding to a respective one of the pluralities of no-connect conductive traces 120'. Each no-connect conductive trace 120' in each of plurality of no-connect conductive traces is connected to the corresponding common conductive trace NC' on the same side of the IC 150'. Each common conductive trace NC' is connected to a respective one of the ESD protection circuits 156'. One of ordinary skill in the art can readily select a design as shown in FIG. 1 or in FIG. 3, as appropriate for any given package. Further, other variations are contemplated, in which other numbers of common conductive traces are provided for ESD protection of the no-connect pins of the BGA substrate (For example, 2 or 3).

In a package having multiple common conductive trace segments NC that are not connected to each other, it is necessary to have at least one conductor (such as wire 140') connecting each of the NC' segments to an ESD protection circuit 156' on the IC. There may be a unique ESD protection circuit 156' for each respective segment NC', or a single ESD protection circuit 156' may be common to all of the NC' segments.

Figure 4:
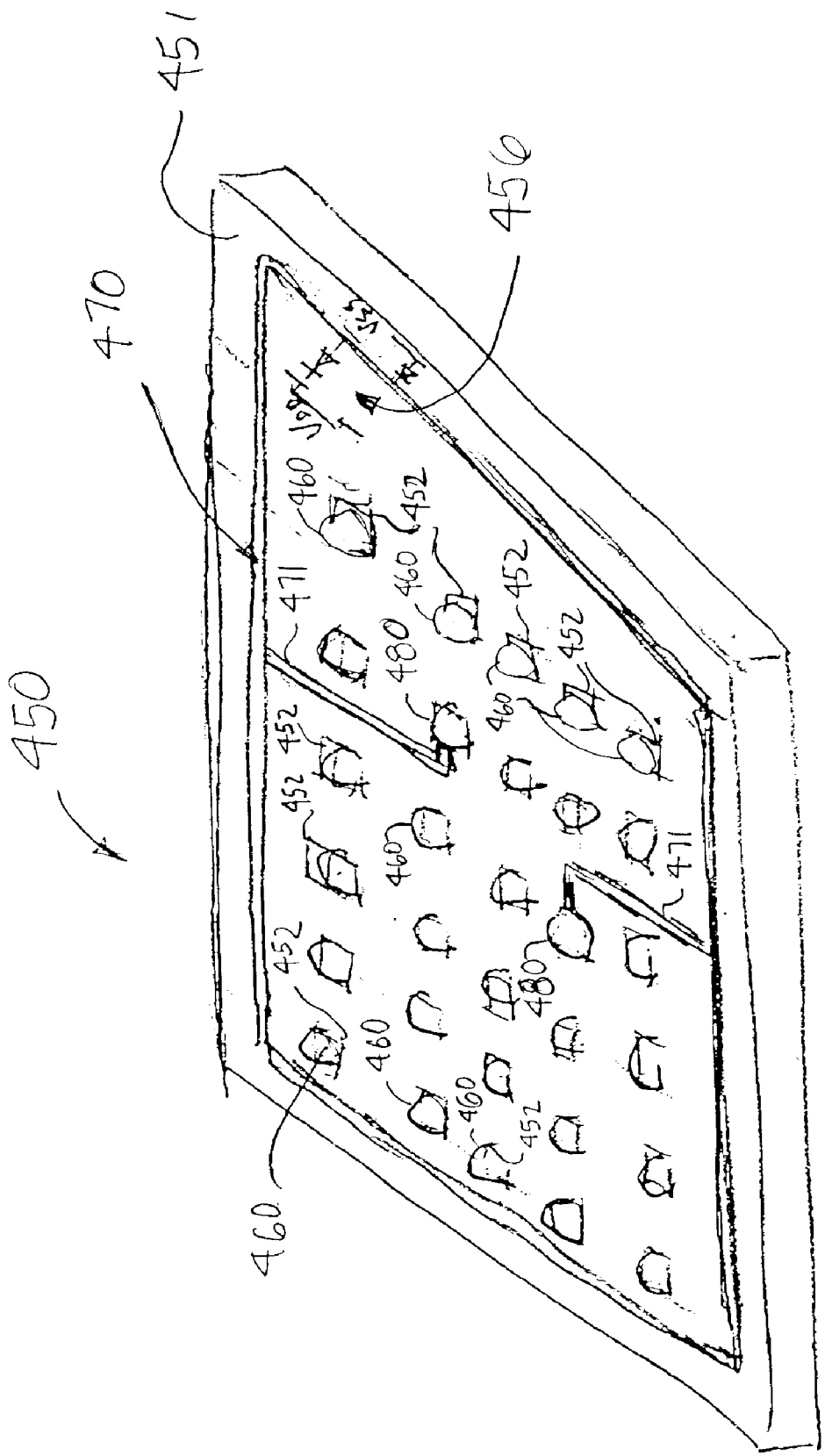
FIG. 4 is an isometric view of the top surface of an IC chip used in a flip-chip embodiment of the present invention.

FIG. 4 is an isometric view of the top (active) surface of an IC chip 450 used in a flip-chip embodiment of the present invention. The IC chip 150 has an array of bond pads 452 on its top surface 451, allowing a greater number of pins than in a wire-bonded chip. Each bond pad 452 has a solder bump 460 on it. Instead of wire bonding the bond pads 452 to contacts on the substrate (not shown in FIG. 4), the chip 450 is flipped over so the solder bumps 460 confront contacts (not shown) on the surface of the substrate (not shown in FIG. 4). The device is heated to reflow the solder bumps 460, and the chip 450 is connected directly to the substrate.

As described above, it is desirable to be able to use a single type of package substrate with different variations of a type of chip. In some variations of the chip, fewer than all of the contacts on the substrate are used. For example, the substrate may have a 16×16 array of 256 contacts, but a given chip 450 mounted to the substrate may only have 200 active bond pads 452. The flip-chip embodiment of FIG. 4 requires a different solution from the wire bonded embodiment of FIGS. 1 and 3, because wire bonding is not used to electrically connect the IC chip bond pads 452 to the substrate. Thus, wire bonding is not used to connect the no-connect contacts of the substrate to a common conductive trace.

According to the embodiment of FIG. 4, the common conductive trace 470 for the no-connect pins of the substrate is located on the IC chip 450 itself (instead of on the substrate, as in FIG. 1). Exemplary IC chip 450 has two solder bumps 480 that are not connected to any circuitry within the IC. Solder bumps 480 are connected (via conductive traces 471) to a bus 470. The bus 470 is connected to an ESD protection circuit 456 of the IC chip 450. In the example of FIG. 4, only two no-connect solder bumps 480 are shown, for ease of illustration. It will be understood by those skilled in the art that the number of no-connect solder bumps 480 is preferably the difference between the number of active bond pads 452 and the number of contacts on the substrate to which the IC chip 450 is connected. In such an embodiment, each no-connect solder bump 480 would have a connection to the bus 470.

Although the bus 470 is shown as a single conductive ring, the bus can be divided into a plurality of segments (in the same way the no-connect common trace NC' of FIG. 3 is divided into a plurality of segments). Each segment of bus 470 may be connected to a respective ESD protection circuit 456.

Referring again to FIG. 1, a method for forming an IC package, according to the invention includes the following steps:

An IC chip 150 is connected to a substrate 110. The IC has at least one ESD protection circuit 156. The IC has a plurality of bond pads 132 that are not coupled to the ESD protection circuit 156. The substrate has a first plurality of conductive traces 130, a second plurality of conductive traces 120 and a common conductive trace NC.

The first plurality of conductive traces 130 are connected to respective bond pads 132 of the IC 150 (e.g., by wire bonding, using a wire bonder manufactured by Kulicke & Soffa Industries, Inc. of Willow Grove, Pa.), without connecting any of the second plurality of conductive traces 120 to any of the plurality of bond pads 132 of the IC.

Each of the second plurality of conductive traces 120 are connected to the common conductive trace NC (e.g., by wire bonding).

If the common conductive trace is segmented (such as trace NC' of FIG. 3), each no-connect conductive trace 120' is connected to a corresponding common conductive trace segment NC'.

The common conductive trace NC is connected to the ESD protection circuit 156 (e.g., by wire bonding). If the common conductive trace is segmented (such as trace NC'of FIG. 3), each common conductive trace segment NC' is connected to a respective ESD protection circuit.

Although the invention has been described in terms of exemplary embodiments, it is not limited thereto. Rather, the appended claims should be construed broadly, to include other variants and embodiments of the invention which may be made by those skilled in the art without departing from the scope and range of equivalents of the invention.

What is claimed is:

1. A method for forming an IC package, comprising:
   (a) connecting an IC to a substrate, the IC having at least one ESD protection circuit that provides protection against electrostatic discharge, the IC having a plurality of bond pads that are not coupled to the ESD protection circuit, the substrate having first and second pluralities of conductive traces, either the IC or the substrate having a common conductive trace;
   (b) connecting the first plurality of conductive traces to respective bond pads of the IC, without connecting any of the second plurality of conductive traces to any of the plurality of bond pads of the IC;
   (c) connecting each of the second plurality of conductive traces to the common conductive trace; and
   (d) connecting the common conductive trace to the ESD protection circuit.

2. The method of claim 1, wherein step (b) includes wire bonding the bond pads to the conductive traces.

3. The method of claim 1, wherein step (c) includes wire bonding each of the second plurality of conductive traces to the common conductive trace.

4. The method of claim 1, wherein step (d) includes wire bonding the common conductive trace to the ESD protection circuit.

5. The method of claim 1, wherein the IC has a respective ESD protection circuit on each side thereof, and the substrate has a respective plurality of no-connect conductive traces on each side of the IC, the no-connect conductive traces not being connected to any of the plurality of bond pads of the IC,
   step (c) includes connecting a respective common conductive trace on each side of the IC to a corresponding respective one of the pluralities of no-connect conductive traces, each no-connect conductive trace in each of plurality of no-connect conductive traces being connected to a corresponding common conductive trace; and
   step (d) includes connecting each common conductive trace to a respective one of the ESD protection circuits.

6. The method of claim 1, wherein step (a) includes connecting the IC to the substrate by a flip-chip mounting.

7. The method of claim 6, wherein step (c) includes connecting each of the second plurality of conductive traces to a single common conductive trace on a periphery of the IC.

8. The method of claim 1, wherein the second plurality of conductive traces include a respective plurality of no-connect conductive traces on each side of the IC, the no-connect conductive traces not being connected to any of the plurality of bond pads of the IC, and step (c) includes connecting each of the pluralities of no-connect conductive traces to a single common conductive trace.

9. The method of claim 7, wherein the single common conductive trace is located on the substrate and has a closed shape that surrounds the IC.

* * * * *